United States Patent [19]
Chou et al.

[11] Patent Number: 5,766,992
[45] Date of Patent: Jun. 16, 1998

[54] PROCESS FOR INTEGRATING A MOSFET DEVICE, USING SILICON NITRIDE SPACERS AND A SELF-ALIGNED CONTACT STRUCTURE, WITH A CAPACITOR STRUCTURE

[75] Inventors: Chen Cheng Chou, Taichung; Jenn Tsao, Taipei, both of Taiwan

[73] Assignee: Taiwan Semiconductor Manufacturing Company Ltd., Hsin-Chu, Taiwan

[21] Appl. No.: 827,814

[22] Filed: Apr. 11, 1997

[51] Int. Cl.[6] .................................. H01L 21/8242
[52] U.S. Cl. .................................. 438/241; 438/595
[58] Field of Search .......................... 438/210, 241, 438/253, 595, 766

[56] References Cited

U.S. PATENT DOCUMENTS

| | | | |
|---|---|---|---|
| 4,960,723 | 10/1990 | Davies | 438/274 |
| 5,030,585 | 7/1991 | Gonzalez et al. | 438/210 |
| 5,155,056 | 10/1992 | Jeong-Gyoo | 438/595 |
| 5,296,400 | 3/1994 | Park et al. | 438/595 |
| 5,364,804 | 11/1994 | Ho et al. | 438/595 |
| 5,395,784 | 3/1995 | Lu et al. | 438/241 |

*Primary Examiner*—Chandra Chaudhari
*Attorney, Agent, or Firm*—George O. Saile; Stephen B. Ackerman

[57] ABSTRACT

A semiconductor fabrication process, allowing integration of MOSFET devices, and capacitor structures, on a single semiconductor chip, has been developed. The process integration features the use of a MOSFET device, fabricated using a self-aligned contact structure, allowing a reduction in the source and drain area needed for contact. Silicon nitride spacers, used on the sides of the polysilicon gate electrode, protect the polysilicon gate structure, during the opening of a self-aligned contact hole.

24 Claims, 8 Drawing Sheets

PROCESS FOR INTEGRATING A MOSFET DEVICE, USING SILICON NITRIDE SPACERS AND A SELF-ALIGNED CONTACT STRUCTURE, WITH A CAPACITOR STRUCTURE

BACKGROUND OF THE INVENTION (1) Field of the Invention

The present invention relates to the fabrication of semiconductor devices, and more specifically to a fabrication sequence used to integrate a metal oxide semiconductor field effect, (MOSFET), device, and a capacitor structure, on a single semiconductor chip.

(2) Description of Prior Art

The semiconductor industry is continually striving to improve the performance of semiconductor devices, while still attempting to reduce the cost of these same devices. These objectives have been successfully addressed by the ability of the semiconductor industry to practice micro-miniaturization, or to fabricate semiconductor devices with sub-micron features. Several fabrication disciplines, such as photolithography, as well as dry etching, have allowed micro-miniaturization to be realized. The use of more sophisticated exposure cameras, as well as the use of more sensitive photoresist films, have allowed the attainment of sub-micron images in photoresist films, to be routine achieved. In addition the development of more advanced dry etching tools and processes, have allowed the sub-micron images, in masking photoresist films, to be successfully transferred to underlying materials used for the fabrication of semiconductor devices.

In addition to advances in semiconductor fabrication disciplines, several device structural innovations have also contributed to the quest for higher performing, lower cost, semiconductor devices. For example the use of a self-aligned contact, (SAC), procedure, allows the amount of source and drain contact area to be reduced, thus allowing smaller devices to be constructed, resulting in faster, as well as lower cost devices, to be realized. The SAC procedure, using a sub-micron groundrule, opens a sub-micron region in an insulator layer, exposing an underlying source and drain region. However only a portion of the sub-micron SAC opening is used to expose the underlying source and drain region, with the remainder of the sub-micron SAC opening overlapping an adjacent polysilicon gate structure. Therefore the source and drain contact region is smaller then the SAC opening. If the contact opening to the source and drain was to made entirely overlay the source and drain region, the source and drain region would have to be designed larger, to accommodate the fully landed contact hole opening, thus resulting in a undesirable, larger semiconductor device. In addition to the cost and performance benefits of devices fabricated using the SAC procedure, a silicon nitride sidewall spacer can also be used, allowing the SAC opening to be created, exposing the insulator sidewall of a polysilicon gate structure. The use of silicon nitride, in place of a silicon oxide spacer, allows a greater degree of insulator integrity, when the metal contact structure is formed in the SAC opening.

This invention will describe a process for integrating a MOSFET device and a capacitor structure, a combination that can be used for a non-volatile, EEPROM chip. The invention will feature a novel process integration sequence, incorporating the SAC structure, using a 0.6 uM diameter opening, and the use of silicon nitride spacers, both used to prevent shorting metal shorting between the MOSFET device and the capacitor structure. Prior art, such as Ho, et al, in U.S. Pat. No. 5,364,804, describes a SAC procedure, however that invention does not incorporate the silicon nitride spacer, nor does that invention describe the process integration of the capacitor structure and the MOSFET device, featured in this invention.

SUMMARY OF THE INVENTION

It is an object of this invention to demonstrate a fabrication process for integrating a MOSFET device and a capacitor structure, on a single semiconductor chip.

It is another object of this invention to use a SAC structure, using a sub-micron diameter, SAC opening, for contact to a source and drain region of a MOSFET device.

It is yet another object of this invention to use silicon nitride spacers, on the sides of a polysilicon gate structure of a MOSFET device, to improve the insulator integrity in the sub-micron diameter SAC opening.

In accordance with the present invention a process for integrating a MOSFET device structure, featuring a SAC structure and a silicon nitride spacer, with a capacitor structure, featuring a silicon nitride—thin silicon oxide dielectric layer, on a semiconductor substrate, is described. A first iteration initiates with the growth of a gate insulator layer, followed by the deposition and doping of a polysilicon layer. A thin layer of silicon oxide is thermally grown on the polysilicon layer, followed by the deposition of a thin silicon nitride layer, to be used subsequently used for the composite dielectric layer of a capacitor structure. An overlying thick, silicon oxide layer is next deposited. Patterning is next performed to define a structure in the thick silicon oxide, thin silicon nitride, polysilicon oxide, and polysilicon layer, to create the shape to be used for a polysilicon gate structure, and to create the shape to be used for the lower electrode of the capacitor structure. Another thin silicon oxide layer is thermally grown on the exposed polysilicon sides, for the gate and capacitor structures. A layer of silicon nitride is then deposited and subjected to an anisotropic dry etching procedures to create silicon nitride spacers, on the sides of the polysilicon gate, and capacitor structures. Source and drain regions are next formed in the MOSFET region, in an area not covered by the polysilicon gate structure. A thick interlevel dielectric layer is deposited and planarized, creating a smooth top surface of the interlevel dielectric layer. Patterning, using photolithography and dry etching procedures are used to open a sub-micron diameter, SAC hole in the interlevel dielectric layer, with the SAC hole partially overlying the silicon nitride spacer, of the polysilicon gate structure, exposing an area of the underlying source and drain region. The patterning procedure also opens an region in the interlevel dielectric layer, and in the thick silicon oxide layer, in the silicon nitride layer, and in the thin silicon oxide layer, exposing the top surface of a polysilicon gate structure, on a FOX region, to be used for a contact to a polysilicon word line. Another photolithographic and etching procedure is then used to open the contact region, in the thick interlevel dielectric layer, and in the thick silicon oxide region, exposing capacitor dielectric layer, silicon nitride. This is performed by initially using non-selective dry etching, and completed by use of a selective wet etch procedure, stopping at the top surface of the silicon nitride layer. Metal deposition, and patterning are used to create SAC metal structures to the MOSFET source and drain regions, in the SAC opening, as well as creating metal contact structures to the polysilicon gate structure. The metal deposition and patterning procedures also create the upper electrode shape of the capacitor structure.

A second iteration of this invention involves the deposition, and doping, of a polysilicon layer, overlying a gate insulator layer, followed by the deposition of an overlying layer of thick silicon oxide. Photolithography and etching procedures are used to remove the thick silicon oxide layer from regions to be used for a capacitor structure. Patterning, via photolithography and dry etching, are used to create a polysilicon gate structure, in the thick silicon oxide and underlying polysilicon layer, while simultaneously forming the lower electrode shape of the capacitor structure, in the polysilicon layer. After thermal oxidation to form a thin silicon oxide layer, on the exposed sides of polysilicon, in the polysilicon gate structure and capacitor structure, silicon nitride spacers are formed on the sides of these structures via deposition of silicon nitride, followed by anisotropic dry etching. A thin capacitor oxide layer is then thermally grown on the top surface of polysilicon, used for the lower electrode shape of the capacitor structure. After deposition of a capacitor silicon nitride layer, a thick interlevel dielectric layer is deposited, followed by planarization procedures, used to create a smooth top surface for the interlevel dielectric layer. Patterning, using photolithography and wet etching procedures, are used to open a region in the interlevel dielectric layer, exposing the capacitor nitride layer, overlying the lower electrode shape of the capacitor structure. Another patterning procedure, using photolithography, wet and dry etching, is next employed to open the SAC hole, in the interlevel dielectric layer, and in the capacitor silicon nitride layer, with the SAC opening partially overlying the silicon nitride spacers on the polysilicon gate structure, and exposing an area of the source and drain region of the MOSFET device. Metal deposition and patterning are used to create the SAC metal structure, to the source and drain region, exposed in the SAC opening of the MOSFET device, as well as creating the upper electrode shape of the capacitor structure.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The method of simultaneously fabricated a MOSFET device, using a SAC structure and silicon nitride spacers, with a capacitor structure, will now be covered in detail. In this description the MOSFET device described is a p-channel, (PFET), device. However this invention is also operable using n-channel, (NFET), devices, or complimentary, (CMOS), devices, in which both NFET and PFET devices, with SAC structures and silicon nitride spacers, are simultaneously fabricated with a capacitor structure.

Figure 1:
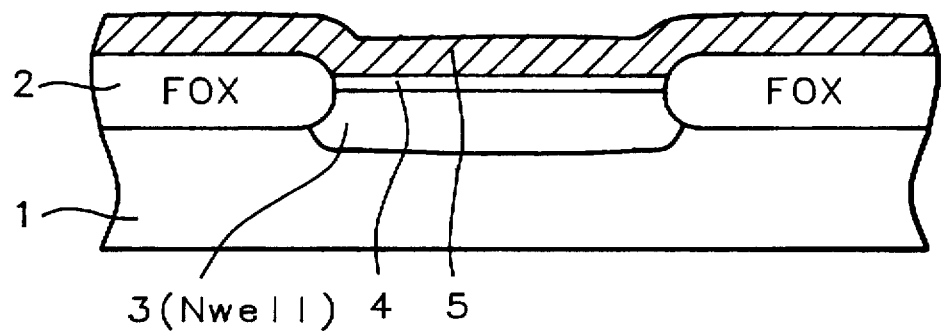
FIGS. 1–7, which schematically, in cross-sectional style, describe a first iteration of this invention, wherein an integration process is used to simultaneously fabricate a MOSFET device, using a SAC structure and silicon nitride spacers, with a capacitor structure.

FIG. 1, schematically shows the early stages of fabrication, for a first iteration of this invention. A P type semiconductor substrate, 1, with a <100>crystallographic orientation, is used. Field oxide, (FOX), regions, 2, are formed for isolation purposes, as well as to provide a base for a subsequent capacitor structure to be fabricated on. FOX regions, 2, are formed via thermal oxidation, of exposed semiconductor substrate, 1, in an oxygen—steam ambient, at a temperature between about 850° to 1050° C., to a thickness between about 3000 to 5000 Angstroms. Subsequent device regions, or regions not converted to FOX region, 2, are protected by a masking pattern of an oxidation resistant composite layer, comprised of an overlying silicon nitride layer, on an underlying pad silicon oxide layer. The desired masking pattern, of the oxidation resistant composite layer, is obtained via conventional photolithographic and dry etching procedures. After formation of the FOX regions, 2, the masking pattern is removed, using hot phosphoric acid for silicon nitride, and a buffered hydrofluoric acid solution for the pad oxide. An N well region, 3, is next formed via ion implantation of phosphorous, at an energy between about 50 to 200 KeV, at a dose between about 2E12 to 3E13 atoms/$cm^2$. The MOSFET device described in this invention will be a PFET device, thus necessitating the creation N well region, 3. However NFET devices can also be fabricated, along with the PFET devices, necessitating the use of a photolithographic procedure used to block a subsequent NFET region from the ion implantation procedure, used for N well creation. A gate insulator layer, 4, comprised of silicon dioxide, is next formed via thermal oxidation, in an oxygen—steam ambient, at a temperature between about 850° to 1000° C., to a thickness between about 50 to 200 Angstroms. An intrinsic layer of polysilicon layer, 5, is then deposited, using low pressure chemical vapor deposition, (LPCVD), techniques, at a temperature between about 550 to 650° C., to a thickness between about 2000 to 4000 Angstroms. A $POCl_3$ procedure is next employed, at a temperature between about 900° to 1000° C., to dope polysilicon layer, 5, to a surface concentration between about 1E20 to 1E21 atoms/$cm^3$. Polysilicon layer, 5, can also be doped via ion implantation procedures using phosphorous or arsenic, or polysilicon layer, 5, can be deposited using in situ doping procedures, via the addition of either arsine or phosphine to a silane ambient.

Figure 2:
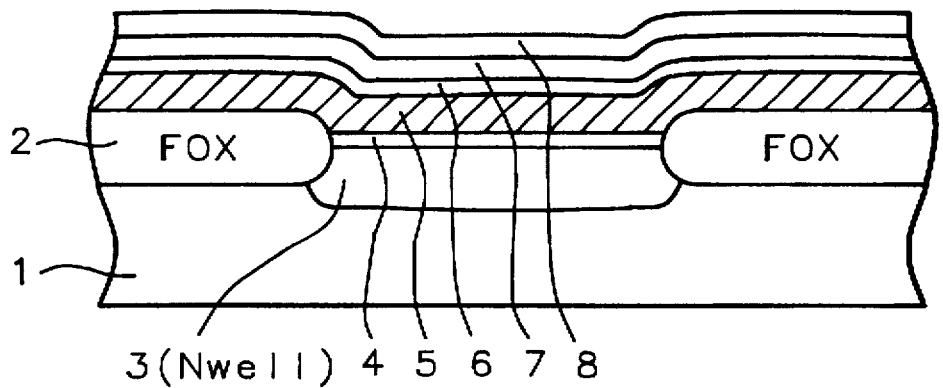

A thin silicon oxide layer, 6, shown schematically in FIG. 2, is next thermally grown from polysilicon layer, 5, in an oxygen—steam ambient, at a temperature between about 850° to 950° C., to a thickness between about 50 to 250 Angstroms. Thin silicon oxide layer, 6, will be subsequently used as a capacitor dielectric layer. A thin silicon nitride layer, 7, is next deposited, using LPCVD or plasma enhanced chemical vapor deposition, (PECVD) , procedures, at a temperature between about 600° to 850° C., to a thickness between about 200 to 1000 Angstroms. Thin silicon nitride layer, 7, will also be used for a capacitor dielectric layer. Another LPCVD or PECVD procedure then employed to deposit silicon oxide layer, 8, at a temperature between about 500° to 800° C., to a thickness between about 100 to 1000 Angstroms, using tetraethylorthosilicate, (TEOS), as a source. This is schematically shown in FIG. 2.

Figure 3:
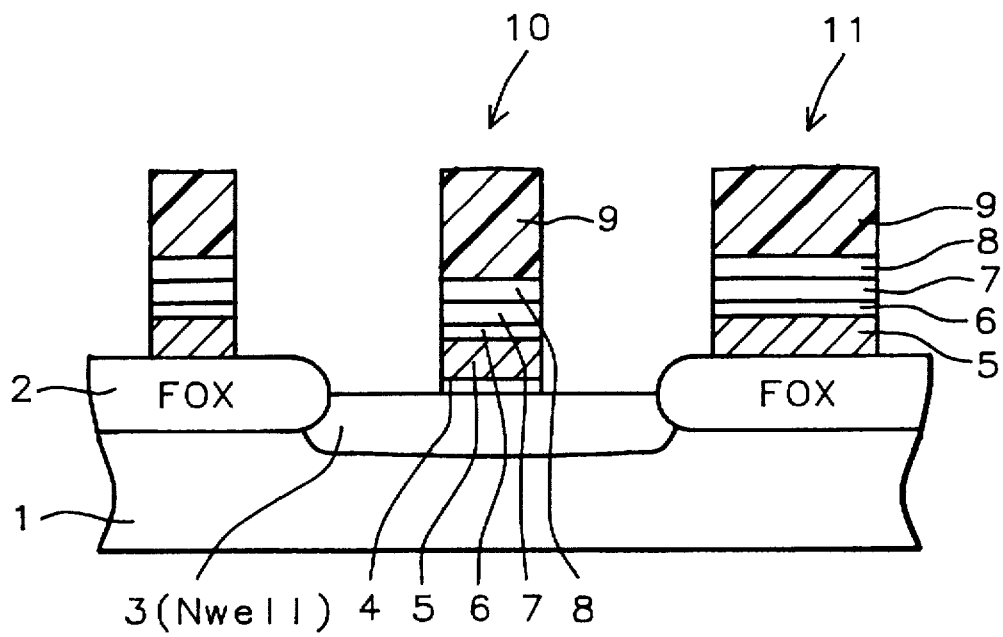

FIG. 3, schematically shows the result of patterning procedures, used to create the shape for a polysilicon gate structure, 10, used for the MOSFET device, for a lower electrode shape for a capacitor structure, 11, as well as for the polysilicon shape, residing on FOX region, 2, to be used for subsequent metal contact to the polysilicon gate structure, of a MOSFET device. A photoresist shape, 9, is used as a mask to allow transfer of this shape, via reactive ion etching, (RIE), procedure, to the underlying layers, using $CHF_3$ as an etchant for silicon oxide layer, 8, silicon nitride layer, 7, and silicon oxide layer, 6, and using $Cl_2$ as an etchant for polysilicon layer, 5, creating the desired structures. Photoresist shape, 9, is removed via plasma oxygen ashing and careful wet cleans. A post RIE procedure, in a buffered hydrofluoric acid solution, removes gate insulator layer, 4, from areas not protected by polysilicon gate structure, 10.

Figure 4:
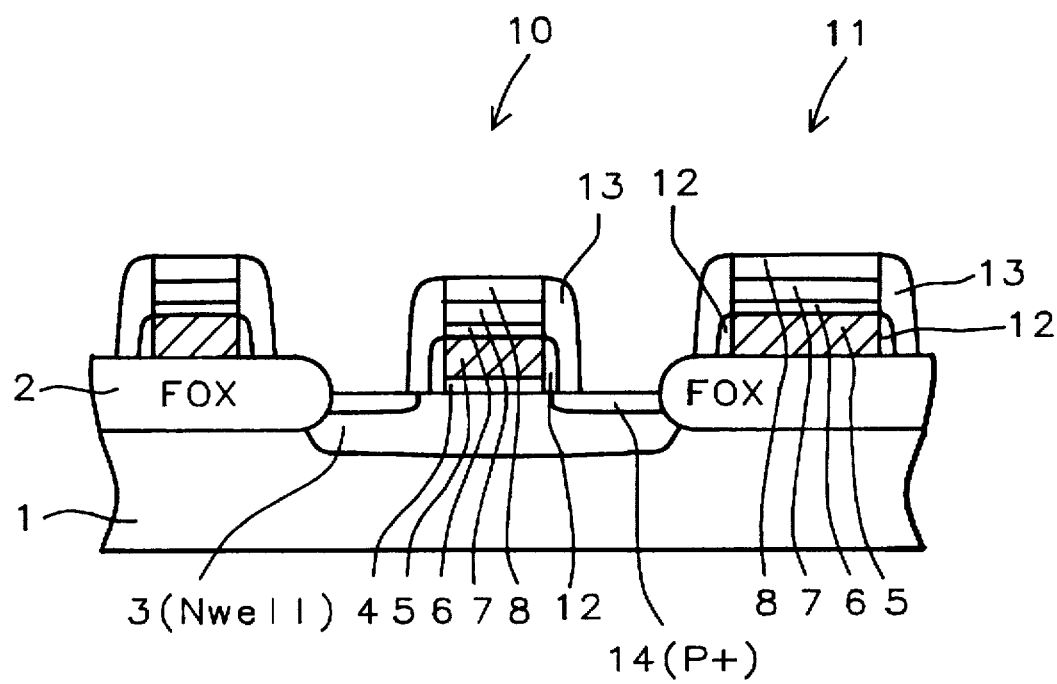

A thin silicon oxide layer, 12, is next formed on the exposed sides of polysilicon shapes, via thermal oxidation procedures, in an oxygen—steam ambient, at a temperature between about 800° to 950° C., to a thickness between about 75 to 100 Angstroms. Silicon nitride spacers, 13, are next formed on the sides of polysilicon gate structure, 10, on the sides of capacitor structure, 11, as well as on the sides of the polysilicon structure, on FOX region, 2, used for contact purposes. Silicon nitride spacers, 13, are created by first depositing a layer of silicon nitride, via LPCVD or PECVD procedures, at a temperature between about 700° to 850° C., to a thickness between about 1000 to 3000 Angstroms, followed by an anisotropic RIE procedure, using $SF_6$ or $CHF_3$ as an etchant, creating silicon nitride spacers, 13, and shown schematically in FIG. 4. A P type, source and drain region, 14, is next formed via ion implantation of either $B^{11}$ or $BF_2$, at an energy between about 15 to 40 KeV, at a dose between about 8E14 to 6E15 atoms/$cm_2$. If this iteration is comprised of both PFET and NFET devices, photoresist masking procedures would be employed to block out NFET regions from the P type source and drain ion implantation procedures, while similar block outs would be used to protect PFET regions during an N type source and drain formation, used to fabricate the NFET devices. In addition the thick silicon oxide layer 8, protects the subsequent capacitor structure 11, from this ion implantation process.

Figure 5:
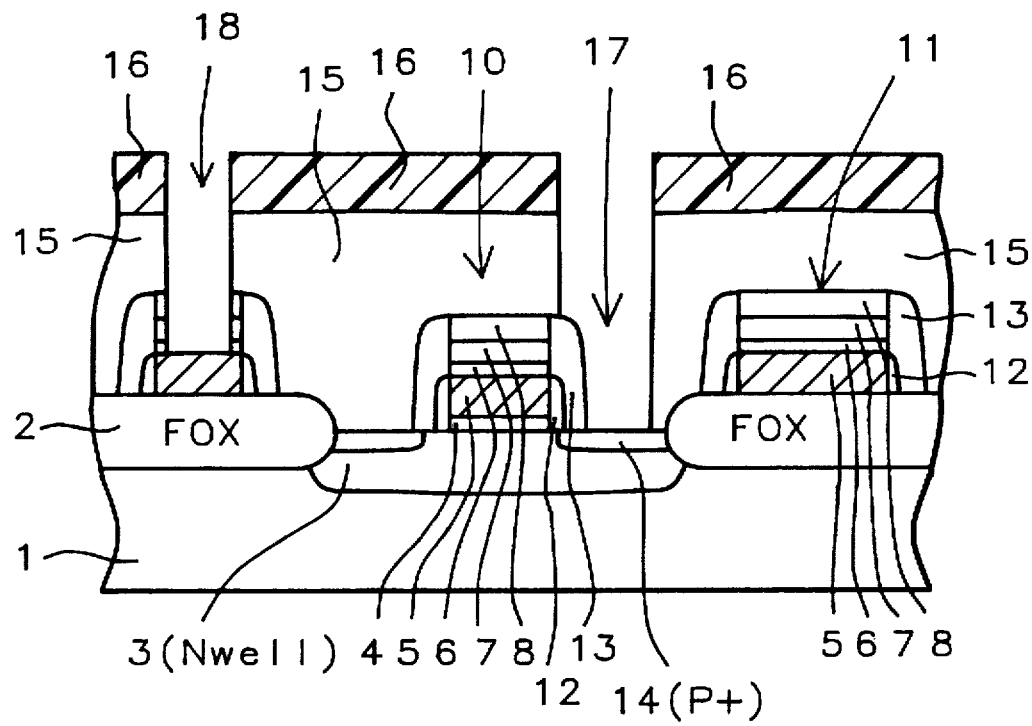

A composite insulator layer of undoped silicate glass, (USG), and a boro-phosphosilicate glass, (BPSG), is next deposited, using PECVD procedures, at a temperature between about 300° to 500° C., to a thickness between about 3000 to 10000 Angstroms. The USG/BPSG interlevel dielectric layer, (ILD), 15, is subjected to a planarization procedure, using chemical mechanical polishing techniques, to create a smooth top surface. This is schematically shown in FIG. 5. A photoresist shape, 16, is formed on the ILD layer, 15, exposing a region to be used for the SAC opening, 17, for MOSFET device structure, 10. Photoresist shape 16, also exposes region, 18, allowing subsequent metal contact to a polysilicon gate structure, residing on a FOX region, to be realized. An anisotropic dry, RIE procedure, using $CHF_3$ as an etchant, is used to open SAC region 17, in ILD layer 15. During this dry etch procedure contact hole 18, is also opened, exposing the top surface of a polysilicon gate structure, on FOX region 2. The opening of contact hole 18, is performed in ILD layer 15, thick silicon oxide layer 8, silicon nitride layer 7, and thin silicon oxide layer 6, using $CHF_3$ as an etchant. Photoresist shape 16, is then removed using plasma oxygen ashing and careful wet cleans.

SAC opening, 17, shown schematically in FIG. 5, is created with a sub-micron diameter, between about 0.5 to 3.0 uM. SAC opening, 17, is designed to overlap silicon nitride spacer, 13, thus allowing the area of source and drain region, 14, needed for contact purposes, to be smaller then the photolithographic dimension, thus allowing device density enhancements to be realized. In addition, the use of silicon nitride as spacers, allows the completion of SAC opening, 17, to progress in a buffered hydrofluoric acid solution, if desired, without risking spacer degradation. Photoresist shape, 16, is removed using plasma oxygen ashing and careful wet cleans.

Figure 6:
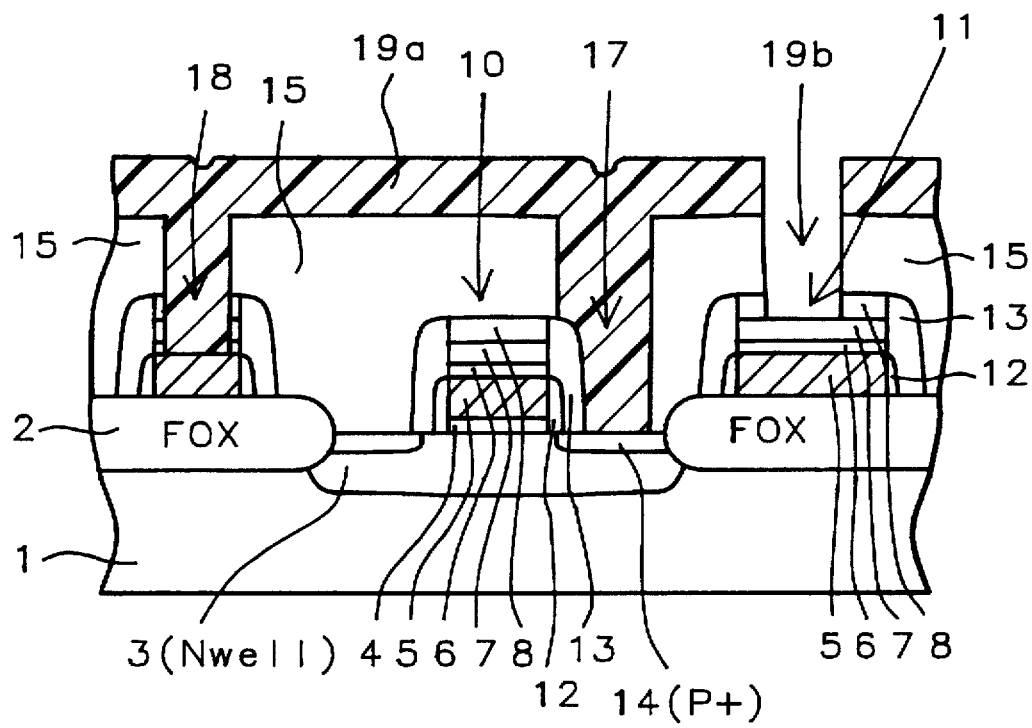

FIG. 6 shows another photoresist layer, 19a, used to create the capacitor contact opening 19b, the contact area for the upper electrode shape of capacitor structure 11. An anisotropic RIE procedure, using $CHF_3$ as an etchant, is first used to remove between about 2000 to 9000 Angstroms of ILD layer 15, leaving between about 800 to 1200 Angstroms of ILD layer 15, remaining in capacitor opening 19b. A wet etch procedure, using a buffered hydrofluoric acid solution, is next used to remove the remaining ILD layer 15, and also to selectively remove thick silicon oxide layer 8, from the top surface of capacitor dielectric layer, silicon nitride 7, in capacitor opening 19b. If the entire removal process would have been performed using only non-selective dry etching procedures, the lack of selectivity between silicon oxide layer 8, and silicon nitride layer 7, may have resulted in unwanted removal of silicon nitride in the capacitor region, resulting in unwanted capacitor values. This is schematically shown in FIG. 6. Photoresist shape 19a, is again removed using plasma oxygen ashing and careful wet cleans.

Figure 7:
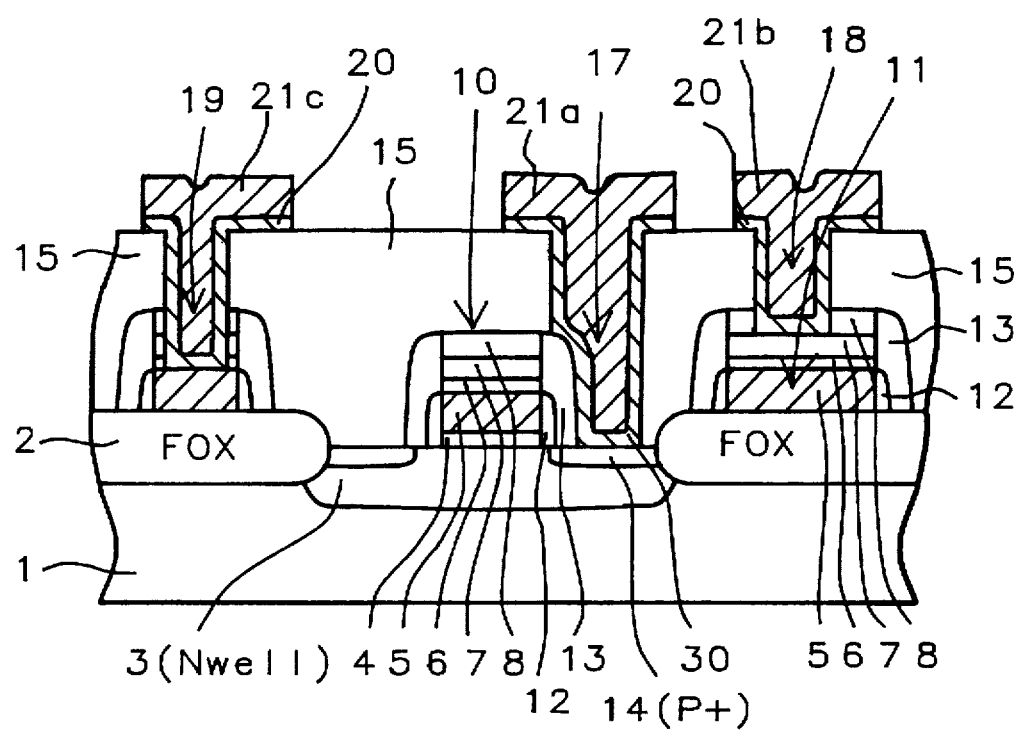

Metal structures, 21a, 21b, and 21c, are next formed, and schematically shown in FIG. 7. After a pre-metal deposition clean, comprised of exposure to a buffered hydrofluoric acid solution, an adhesive and barrier composite layer of titanium and titanium nitride, are deposited using r.f. sputtering procedures, followed by another r.f. sputtered deposition of aluminum, containing between about 1 to 3% copper, and between about 0.5 to 2% silicon. Patterning to create the metal structures, is performed using conventional photolithographic and anisotropic RIE procedures, using $Cl_2$ as an etchant. The masking photoresist layer is again removed via plasma oxygen ashing and careful wet clean processes. The SAC metal structure, 21a, contacts source and drain region, 14, while metal structure, 21c, contacts the polysilicon gate structure, in a region in which the polysilicon gate structure, of a MOSFET device, overlaid a FOX region. Metal structure, 21b, serves as the upper electrode shape of capacitor structure, 11, lying on the top surface of the composite capacitor dielectric layer of silicon nitride 7,—silicon oxide 6.

A second iteration of this invention, again using a SAC structure, and silicon nitride spacers, to allow simultaneous fabrication of MOSFET and capacitor structures, is described using FIGS. 8–15, however for this iteration the polysilicon gate structure created does not include the capacitor dielectric layers as part of the polysilicon gate structure, but uses a thick silicon oxide layer, overlying the polysilicon layer. The capacitor dielectric layers are then formed after the definition of the polysilicon gate structure.

Figure 8:
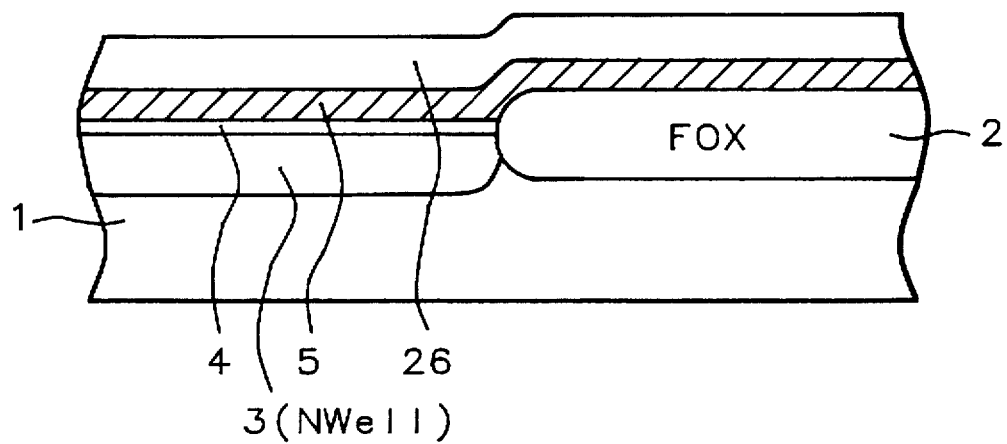
FIGS. 8–15, which schematically, in cross-sectional style, describe a second iteration of this invention, wherein a different integration process is used to simultaneously fabricate a MOSFET device, using a SAC structure and silicon nitride spacers, with a capacitor structure.
Figure 9:
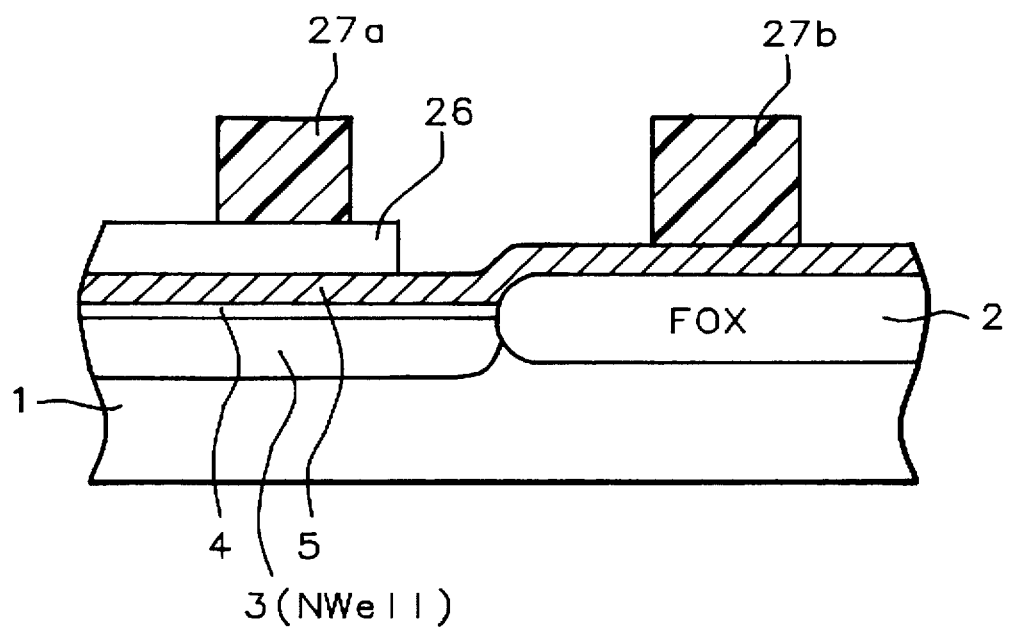

FIG. 8, schematically shows a FOX region, 2, an N well region, 3, a gate insulator layer, 4, and a polysilicon layer, 5, obtained using identical conditions described in the first iteration of this invention, in Fig. 1. A thick silicon oxide layer, 26, is next deposited via LPCVD or PECVD procedures, at a temperature between about 500° to 800° C., to a thickness between about 1000 to 3500 Angstroms, using TEOS as a source. Silicon oxide layer, 26, is then removed from underlying polysilicon layer, 5, in regions to be used for the construction of capacitor structure. This is accomplished using photolithographic and either wet or dry etching procedures. Photoresist shape, 27a, is next formed on silicon oxide layer, 26, to supply the masking shape for a subsequent polysilicon gate structure, while photoresist shape, 27b, is formed on polysilicon layer, 5, in a region in which a subsequent capacitor structure will be formed. This is schematically shown in FIG. 9.

Figure 10:
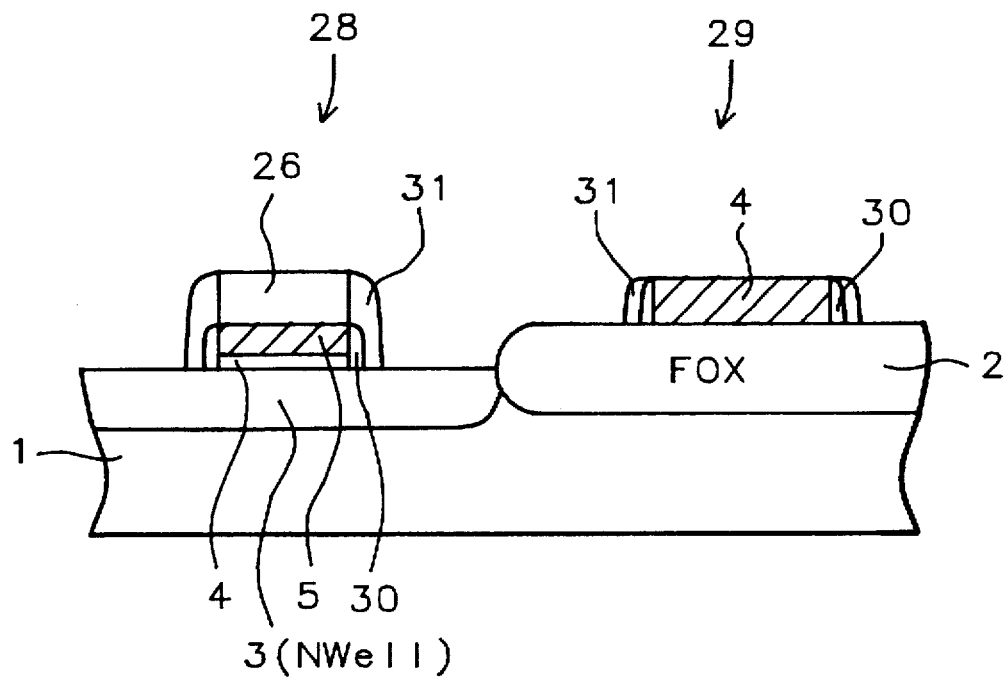
Figure 11:
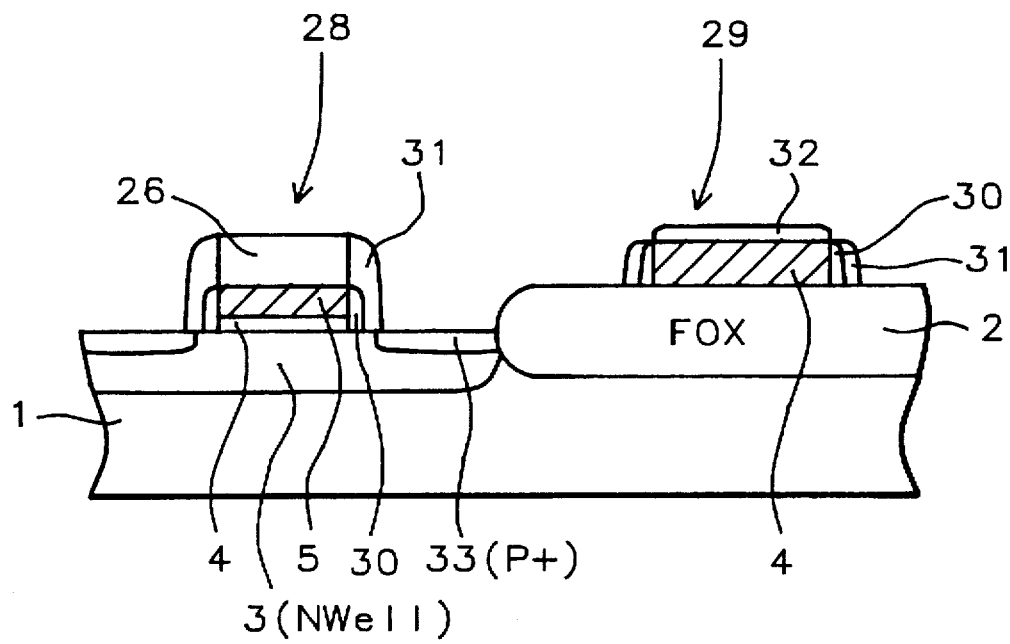

An anisotropic RIE procedure, using $CHF_3$ as an etchant for silicon oxide layer, 26, and $Cl_2$ as an etchant for polysilicon layer, 5, is used to create polysilicon gate structure, 28, while the $Cl_2$ phase of the anisotropic RIE procedure, defines the bottom electrode shape for capacitor structure, 29, shown schematically in FIG. 10. After photoresist removal, using plasma oxygen ashing and careful wet cleans, a silicon oxide layer, 30, is formed on the exposed sides of polysilicon, for polysilicon gate structure, 28, as well as for capacitor structure, 29. Silicon oxide layer, 30, is formed via thermal oxidation, in an oxygen—steam ambient, at a temperature between about 800° to 950° C., to a thickness between about 75 to 100 Angstroms. Silicon nitride spacers, 31, shown schematically in FIG. 10, are then formed on the sides of polysilicon gate structure, 28, and on the sides of the capacitor structure, 29, using deposition and anisotropic RIE conditions, identical to conditions used to create silicon nitride spacers, 13, described in the first iteration of this invention, and shown in FIG. 4. The anisotropic RIE procedure used to create silicon nitride spacers, 31, removes silicon oxide layer, 30, from the top surface of polysilicon layer, 5, for capacitor structure, 29.

Figure 12:
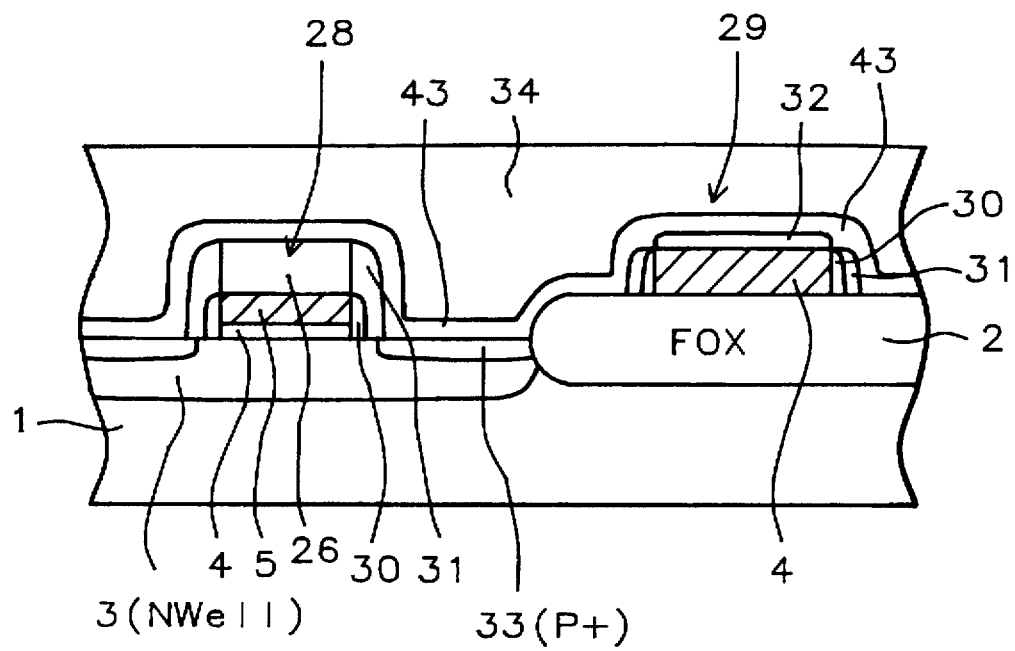

A silicon oxide layer, 32, used as a capacitor dielectric for capacitor structure, 29, is thermally grown, in an oxygen—steam ambient, at a temperature between about 850° to 950° C., to a thickness between about 50 to 250 Angstroms. A photoresist shape, (not shown in drawings), is used as a mask to protect subsequent capacitor structure 29, from the creation of a P type source and drain region, 33, formed in the MOSFET region 28, and shown schematically in FIG. 11. The conditions used to form P type source and drain region 33, are identical to conditions used to form P type source and drain regions, 14, used in the first iteration. A layer of silicon nitride, 43, is then deposited, using PECVD or LPCVD procedures, at a temperature between about 700° to 850° C., to a thickness between about 200 to 1000 Angstroms. Silicon nitride layer, 43, shown schematically in FIG. 12, is used as part of a composite dielectric layer for capacitor structure, 29. An interlevel dielectric layer, 34, comprised of USG and BPSG layers, is next deposited and planarized, again using conditions identical to the conditions used to form the planarized ILD layer, 15, used with the first iteration of this invention. This is schematically shown in FIG. 12.

Figure 13:
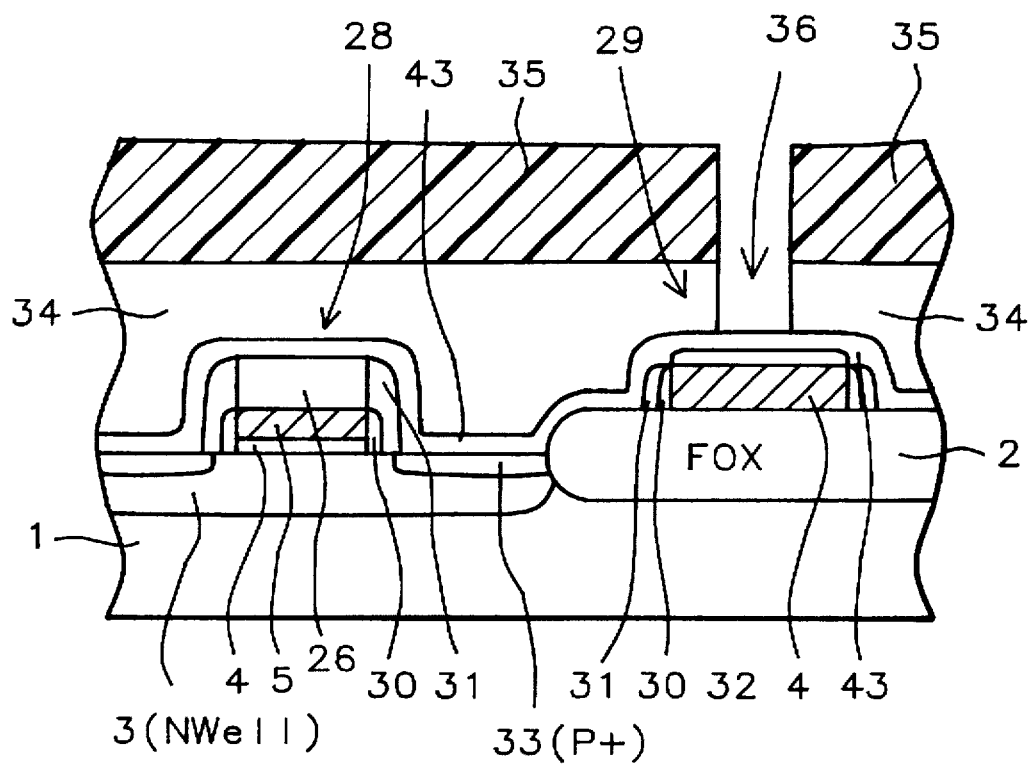
Figure 14:
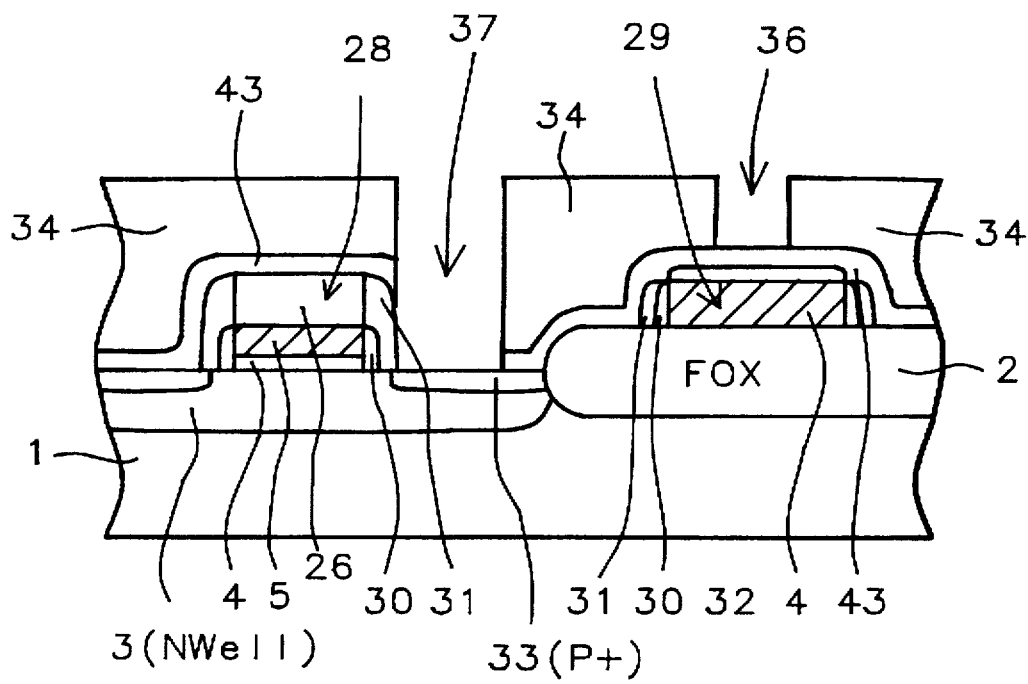

A photoresist shape, 35, is used to define the upper electrode shape for capacitor structure, 29. A wet etch procedure, using a buffered hydrofluoric acid solution, is used for hole opening, 36, exposing the area to be used for the upper electrode shape, for capacitor structure, 29. The selective wet etch procedure did not allow silicon nitride, capacitor dielectric layer, 43, to be attacked during the hole opening procedure. This is schematically shown in FIG. 13. Photoresist shape, 35, is removed using plasma oxygen ashing procedures and careful wet cleans. Another photoresist shape, (not shown), is used to define SAC opening, 37, shown schematically in FIG. 14. Again as was the case in the first iteration, SAC opening, 37, is designed to overlap silicon nitride spacers, 31, for polysilicon gate structure, 28, allowing a SAC opening, with a diameter between about 1.0 to 5.0 uM, to be used to expose an area of source and drain region, 33, smaller then the area used for the SAC opening. The procedure used to define SAC opening, 37, is to initially wet etch ILD layer, 34, via use of a buffered hydrofluoric acid solution, until silicon nitride layer, 43, is exposed, then complete the SAC opening procedure via anisotropic RIE, using $SF^6$ as an etchant. Photoresist removal is accomplished using plasma oxygen ashing and careful wet cleans.

Figure 15:
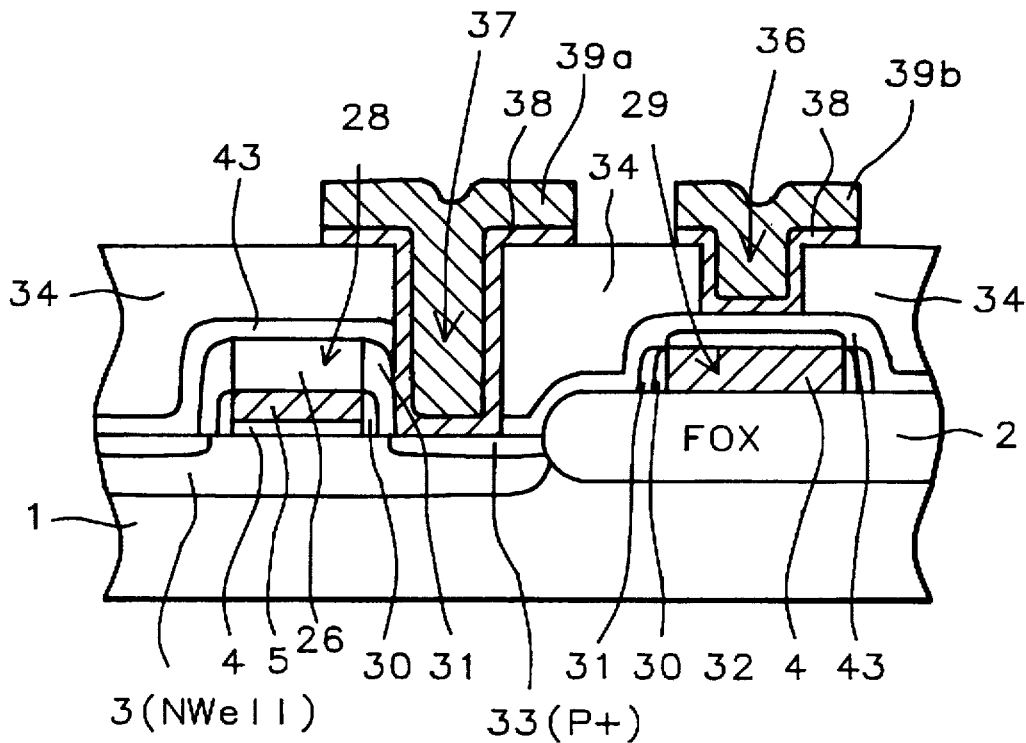

FIG. 15, schematically shows the formation of SAC metal structure, 39a, for the MOSFET structure, 28, as well as the upper electrode shape, 39b, for capacitor structure, 29. The metal layers, and patterning procedures, used to create these structures are identical to the metal layers and patterning procedures used to create SAC metal structure, 21a, and upper electrode structure, 21b, used with the first iteration of this invention.

While this invention has been particularly shown and described with reference to, the preferred embodiments thereof, it will be understood by those skilled in the art that various changes in form and details may be made without departing from the spirit and scope of this invention.

What is claimed is:

1. A fabrication procedure for integrating a MOSFET device, and of a capacitor structure, on a semiconductor substrate, comprising the steps of:

forming field oxide regions in said semiconductor substrate;

forming an N well region, in an area of said semiconductor substrate, to be used for said MOSFET device;

growing a gate insulator layer on said semiconductor substrate;

depositing a polysilicon layer on said FOX regions, and on said gate insulator layer;

doping of said polysilicon layer;

growing a capacitor silicon oxide layer on said polysilicon layer;

depositing a capacitor silicon nitride layer on said capacitor silicon oxide layer;

depositing a first silicon oxide layer on said capacitor silicon nitride layer;

patterning to create a polysilicon gate structure, on said gate insulator layer, comprised of said first silicon oxide layer, said capacitor silicon nitride layer, said capacitor silicon oxide layer, and said polysilicon layer;

patterning to create a polysilicon gate, contact structure, on a first FOX region, comprised of said first silicon oxide layer, said capacitor silicon nitride layer, said capacitor silicon oxide layer, and said polysilicon layer;

patterning to create a lower electrode shape, for said capacitor structure, on a second FOX region, comprised of said first silicon oxide layer, said capacitor silicon nitride layer, said capacitor silicon oxide layer, and said polysilicon layer;

growing a thin sidewall silicon oxide layer, on the exposed polysilicon sides of said polysilicon gate structure, on said gate insulator layer, on the exposed polysilicon sides of said polysilicon gate, contact structure, on said first FOX region, and on exposed polysilicon sides of said lower electrode shape;

depositing a sidewall silicon nitride layer;

anisotropic etching of said sidewall silicon nitride layer to create silicon nitride spacers on the sides of said polysilicon gate structure, on said gate insulator layer, on the sides of said polysilicon gate, contact structure, on said first FOX region, and on the sides of said lower electrode shape;

ion implanting a first conductivity imparting dopant, into a region of said semiconductor substrate, not covered by said FOX regions, and not covered by said polysilicon gate structure, to form source and drain regions for said MOSFET device;

depositing an interlevel dielectric layer, comprised of an underlying, undoped silicon oxide layer, and an overlying, doped silicon oxide layer;

planarizing said interlevel dielectric layer;

opening a self-aligned contact, (SAC), hole, in said interlevel dielectric layer, with said SAC opening exposing an area of said source and drain region, and partially extended over said polysilicon gate structure, of said MOSFET device;

opening a hole in said interlevel dielectric layer, and in said first silicon oxide layer, exposing said capacitor silicon nitride layer, overlying said lower electrode shape, defining an area for an upper electrode shape, for said capacitor structure;

opening a contact hole in said interlevel dielectric layer, in said first silicon oxide layer, in said capacitor silicon nitride layer, and in said capacitor silicon oxide layer, exposing top surface of said polysilicon layer, of said polysilicon gate, contact structure;

depositing a metal layer;

patterning of said metal layer, forming a self-aligned contact structure, in said SAC hole, contacting underlying, said source and drain regions, of said MOSFET device;

patterning of said metal layer, forming a metal contact structure, to top surface of said polysilicon layer, of said polysilicon gate, contact structure, on said first FOX region; and patterning of said metal layer, forming an upper electrode shape for said capacitor structure.

2. The method of claim 1, wherein said gate insulator layer is silicon dioxide, thermally grown in an oxygen—steam ambient, at a temperature between about 850° to 1000° C., to a thickness between about 50 to 200 Angstroms.

3. The method of claim 1, wherein said polysilicon layer is deposited using LPCVD procedures, at a temperature between about 550° to 650° C., to a thickness between about 2000 to 4000 Angstroms.

4. The method of claim 1, wherein said capacitor silicon oxide layer is thermally grown, in an oxygen—steam ambient, at a temperature between about 850° to 950° C., to a thickness between about 50 to 250 Angstroms.

5. The method of claim 1, wherein said capacitor silicon nitride layer is deposited using LPCVD or PECVD procedures, at a temperature between about 700° to 850° C., to a thickness between about 200 to 1000 Angstroms.

6. The method of claim 1, wherein said sidewall silicon nitride layer is deposited using LPCVD or PECVD procedures, at a temperature between about 700° to 850° C., to a thickness between about 1000 to 3000 Angstroms.

7. The method of claim 1, wherein said silicon nitride spacers are formed via anisotropic RIE of said sidewall silicon nitride layer, using $SF_6$ or $CHF_3$ as an etchant.

8. The method of claim 1, therein said first conductivity imparting dopant is $B^{11}$ or $BF_2$, ion implanted at an energy between about 20 to 40 KeV, at a dose between about 8E14 to 6E15 atoms/$cm_2$.

9. The method of claim 1, wherein said interlevel dielectric layer is comprised of an underlying layer of said undoped, silicon oxide, and an overlying layer of said doped silicon oxide, with said doped silicon oxide comprised of boro-phosphosilicate glass, deposited using PECVD procedures, at a temperature between about 300° to 500° C., to a thickness between about 3000 to 10000 Angstroms.

10. The method of claim 1, wherein said SAC opening, is created via anisotropic RIE procedures, using $CHF_3$ as an etchant, with said SAC opening having a diameter between about 0.50 to 3.0 μM.

11. The method of claim 1, wherein region for said upper electrode shape, for said capacitor structure, is opened via initial etching of said interlevel dielectric layer, using anisotropic RIE procedures, using $CHF_3$ as an etchant, and completed by using a buffered hydrofluoric acid solution to etch said first silicon oxide layer.

12. The method of claim 1, wherein said SAC structure, and said upper electrode shape, are comprised of an underlying layer of titanium—titanium nitride, and an overlying layer of aluminum, containing between about 1 to 3% copper, and between about 0.5 to 2% silicon.

13. A fabrication process for integrating a MOSFET device and a capacitor structure, on a semiconductor substrate, with said MOSFET device having a self-aligned contact structure to source and drain regions, and having silicon nitride spacers, on the sides of a polysilicon gate structure, comprising the steps of:

forming field oxide regions in said semiconductor substrate;

forming an N well region in an area of said semiconductor substrate, to be used for said MOSFET device;

growing a silicon dioxide gate insulator layer on said semiconductor substrate;

depositing a polysilicon layer on said silicon dioxide gate insulator layer, and on said FOX regions;

doping said polysilicon layer;

depositing a first silicon oxide layer on said polysilicon layer;

removing said first silicon oxide region from said polysilicon layer, in a region wherein said capacitor structure is to be formed, while leaving said first silicon oxide layer, on said polysilicon layer, in a region in which said MOSFET device is to be formed;

patterning of said first silicon oxide layer, and of said polysilicon layer, to create a polysilicon gate structure, for said MOSFET device, on said silicon oxide gate insulator layer;

patterning of said polysilicon layer to create a lower electrode shape, for said capacitor structure, on said field oxide region;

growing a thin sidewall silicon oxide layer on the exposed polysilicon sides of said polysilicon gate structure, and on the exposed polysilicon sides of said lower electrode shape, for said capacitor structure;

depositing a sidewall silicon nitride layer;

anisotropic etching of said sidewall silicon nitride layer, to form said silicon nitride spacers on the sides of said polysilicon gate structure, of said MOSFET device, and to form said silicon nitride spacers on the sides of said lower electrode shape, for said capacitor structure;

growing a silicon oxide capacitor layer, on the top surface of said lower electrode shape;

ion implanting a first conductivity imparting dopant into a region of said semiconductor substrate, not covered by said polysilicon gate structure, and not covered by said FOX regions, to create source and drain regions, for said MOSFET device;

depositing a silicon nitride capacitor layer;

depositing an interlevel dielectric layer, on said silicon nitride capacitor layer, with said interlevel dielectric layer comprised of an underlying, undoped silicon oxide layer, and an overlying layer of doped silicon oxide;

planarizing said interlevel dielectric layer;

opening a hole in said interlevel dielectric layer, exposing said silicon nitride capacitor layer, overlying said lower electrode shape, defining an area for an upper electrode shape, for said capacitor structure;

opening a self-aligned contact, (SAC), hole, in said interlevel dielectric layer, and in said silicon nitride capacitor layer, to expose said source and drain region, with said SAC hole partially extending over said polysilicon gate structure;

depositing a metal layer;

patterning of said metal layer, forming said SAC structure, in said SAC hole, contacting said source and drain region, of said MOSFET device; and patterning of said metal layer, forming said upper electrode shape, for said capacitor structure.

14. The method of claim 13, wherein said silicon dioxide gate insulator layer is thermally grown, in an oxygen steam ambient, at a temperature between about 850° to 1000° C., to a thickness between about 50 to 200 Angstroms.

15. The method of claim 13, wherein said polysilicon layer is deposited using LPCVD procedures, at a temperature between about 550° to 650° C., to a thickness between about 2000 to 4000 Angstroms.

16. The method of claim 13, wherein said sidewall silicon nitride layer is deposited using LPCVD or PECVD procedures, at a temperature between about 700° to 850° C., to a thickness between about 200 to 1000 Angstroms.

17. The method of claim 13, wherein said silicon nitride spacers are created via anisotropic RIE of said sidewall silicon nitride layer, using $SF_6$ or $CHF_3$ as an etchant.

18. The method of claim 13, wherein said silicon oxide capacitor layer is thermally grown, at a temperature between about 850° to 950° C., to a thickness between about 50 to 250 Angstroms.

19. The method of claim 13, wherein said first conductivity imparting dopant, used to form said source and drain regions, is $B^{11}$ of $BF_2$, ion implanted at an energy between about 20 to 40 KeV, at a dose between about 8E14 to 6E15 atoms/$cm^2$.

20. The method of claim 13, wherein said silicon nitride capacitor layer is deposited via LPCVD or PECVD procedures, at a temperature between about 700° to 850° C., to a thickness between about 200 to 1000 Angstroms.

21. The method of claim 13, wherein said interlevel dielectric layer, is deposited using PECVD procedures, at a temperature between about 300° to 500° C., to a thickness between about 3000 to 10000 Angstroms, and is comprised of an underlying, said undoped silicon oxide layer, and an overlying layer of boro-phosphosilicate glass.

22. The method of claim 13, wherein said SAC hole is created via buffered hydrofluoric acid, wet etching of said interlevel dielectric layer, and anisotropic RIE of said silicon nitride capacitor layer, using $SF_6$ as an etchant, with said SAC hole having a diameter between about 1.0 to 5.0 µM.

23. The method of claim 13, wherein hole in said interlevel dielectric layer, defining the space for said upper electrode shape, is created via a buffered hydrofluoric acid wet etch procedure.

24. The method of claim 1, wherein said SAC structure, of said MOSFET device, and said upper electrode shape, of said capacitor structure, are comprised of an underlying titanium—titanium nitride layer, and an overlying layer of an aluminum based metal, containing between about 1 to 3% copper, and between about 0.5 to 2% silicon.

* * * * *